(12) United States Patent
Voronin

(10) Patent No.: US 11,189,462 B1
(45) Date of Patent: Nov. 30, 2021

(54) ION STRATIFICATION USING BIAS PULSES OF SHORT DURATION

(71) Applicant: Tokyo Electron Limited, Tokyo (JP)

(72) Inventor: Sergey Voronin, Albany, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/934,871

(22) Filed: Jul. 21, 2020

(51) Int. Cl.
*H01L 21/311* (2006.01)
*H01J 37/32* (2006.01)

(52) U.S. Cl.
CPC .. *H01J 37/32146* (2013.01); *H01L 21/31116* (2013.01); *H01J 2237/3341* (2013.01); *H01J 2237/3348* (2013.01)

(58) Field of Classification Search
None
See application file for complete search history.

(56) References Cited

U.S. PATENT DOCUMENTS

| | | |
|---|---|---|
| 6,527,918 B2 | 3/2003 | Goeckner |
| 8,545,670 B2 | 10/2013 | Kojima |
| 8,664,561 B2 | 3/2014 | Hadidi et al. |
| 9,123,509 B2 | 9/2015 | Papasouliotis |
| 10,181,412 B2 | 1/2019 | Marakhtanov et al. |
| 2009/0008577 A1* | 1/2009 | Walther ............ H01J 37/32412 250/492.21 |
| 2014/0034611 A1 | 2/2014 | Godet et al. |
| 2016/0148786 A1 | 5/2016 | Marakhtanov et al. |
| 2020/0058470 A1* | 2/2020 | Ventzek ............ H01L 21/6831 |

OTHER PUBLICATIONS

Liberman, M.A., "Model of plasma immersion ion implantation." Journal of Applied Physics, vol. 66, No. 7, Oct. 1, 1989, 5 pages.
Linder, Barry P., and Nathan W. Cheung. "Modeling of Energy Distributions for Plasma Implantation." Surface and Coatings Technology, vol. 136, No. 1-3, 2001, pp. 132-137., doi:10.1016/s0257-8972(00)01042-2.

* cited by examiner

*Primary Examiner* — Shamim Ahmed
(74) *Attorney, Agent, or Firm* — Slater Matsil, LLP

(57) ABSTRACT

A method of plasma processing includes generating plasma in a plasma processing chamber containing a first species, a second species, and a substrate. The plasma includes a plasma sheath, first species ions, and second species ions. The first species has a first mass and the second species has a second mass that is less than the first mass. The method further includes applying a pulse train of negative bias pulses to the substrate. Each of the negative bias pulses has a pulse duration less than 10 μs and spatially stratifies the first species ions and the second species ions in the plasma sheath. No bias voltage is applied to the substrate during a pulse delay after each negative bias pulse. The pulse delay is at least five times the pulse duration.

15 Claims, 7 Drawing Sheets

ION STRATIFICATION USING BIAS PULSES OF SHORT DURATION

TECHNICAL FIELD

The present invention relates generally to plasma processing, and, in particular embodiments, methods and systems for plasma processing that spatially stratify species of ions in plasma using bias pulses of short duration.

BACKGROUND

Device fabrication within microelectronic workpieces may involve a series of manufacturing techniques including formation, patterning, and removal of a number of layers of material on a substrate. There is a consistent and continuous push to improve the fabrication processes, features, and capabilities of microelectronics. These improvements may require new chemistry development as well as new advanced methods for process control.

Plasma processing is used in semiconductor device fabrication for many manufacturing techniques, such as deposition and etching. Pulsed plasma processing methods may utilize pulses of source power and/or bias power to control various parameters during plasma processing. For instance, radio frequency (RF) power or direct current (DC) power may be pulsed. RF power may also be combined with a DC offset, such as when applying bias pulses to an electrode.

The plasma may include various species mixed together within the processing chamber. Additionally, each species within the plasma may generate a variety of plasma products such as ions, radicals, electrons, and dissociation products. The plasma products of each species may have different properties and be included for different purposes in the plasma. For example plasma products of different species may be different chemical properties such as differing reactivity relative to various materials of a substrate being processed. Further, various species within the plasma (and consequently the corresponding plasma products) may have different masses, in addition to many other distinguishing features.

Control over individual species and species products within plasma may be advantageous to maximize respective roles of the species during plasma processing. For instance it may be desirable to control relative flux rates of various plasma products at a substrate in order to further optimize desirable parameters such as selectivity, etch profile, critical dimension, and others. Therefore, a novel plasma processing approach for advanced process control of individual species and species products of the plasma may be desirable.

SUMMARY

In accordance with an embodiment of the invention, a method of plasma processing includes generating plasma in a plasma processing chamber containing a first species, a second species, and a substrate. The plasma includes a plasma sheath, first species ions, and second species ions. The first species has a first mass and the second species has a second mass that is less than the first mass. The method further includes applying a pulse train of negative bias pulses to the substrate. Each of the negative bias pulses has a pulse duration less than 10 µs and spatially stratifies the first species ions and the second species ions in the plasma sheath. No bias voltage is applied to the substrate during a pulse delay after each negative bias pulse. The pulse delay is at least five times the pulse duration.

In accordance with another embodiment of the invention a method of plasma processing includes generating plasma in a plasma processing chamber containing a less-reactive species, a more-reactive species, and a substrate including an etchable surface, increasing the flux and energy of ions of the less-reactive species at the substrate relative to the flux and energy of ions of the more-reactive species at the substrate by applying a pulse train of negative bias pulses to the substrate, and etching the etchable surface of the substrate using the radicals of the more-reactive species. The plasma includes the ions of the less-reactive species, and the ions and radicals of the more-reactive species. The mass of the less-reactive species is less than the mass of the more-reactive species. The reactivity of the less-reactive species towards the etchable surface is less than the reactivity of the more-reactive species towards the etchable surface. Each negative bias pulse has a pulse duration less than 10 µs.

In accordance with still another embodiment of the invention a plasma processing apparatus includes a plasma processing chamber, a substrate disposed in the plasma processing chamber, and a short pulse generator coupled to the substrate. The plasma processing chamber is configured to contain a plasma including a plasma sheath, ions of a first species, and ions of a second species. The first species has a first mass and the second species has a second mass less than the first mass. The short pulse generator is configured to generate a pulse train of negative bias pulses. Each of the negative bias pulses has a pulse duration less than 10 µs. A pulse delay between successive negative bias pulses is at least five times the pulse duration. The pulse train spatially stratifies the ions of the first species and the ions of the second species in the plasma sheath.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A, 1B, and 1C schematically illustrate an example plasma in the presence of a bias electrode in accordance with an embodiment of the invention, wherein FIG. 1A shows a wall sheath of the plasma interfacing with the bias electrode when no voltage is applied, FIG. 1B shows a matrix sheath of the plasma interfacing with the bias electrode when a pulsed voltage is applied, and FIG. 1C shows a Child-Langmuir sheath of the plasma interfacing with the bias electrode when continuous DC voltage is applied;

Figure 1A:
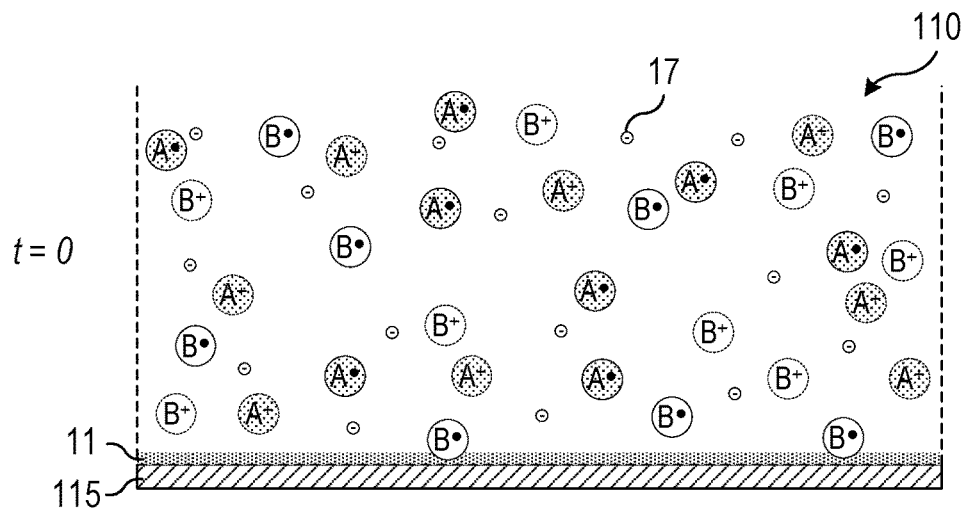

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

During plasma processing used in semiconductor device fabrication, a variety of species may be present within the plasma for a variety of reasons. For example, an inert gas (e.g. used as a carrier gas) is typically mixed with one or more reactive gases with a plasma processing chamber. As a basic scenario, species A and species B mixed in the plasma processing chamber may be ionized in the plasma to produce corresponding positively charged ions such as ions $A^+$ and ions $B^+$ as well as other ionized cracking patterns. Bias power may be applied at a bias electrode, (e.g. to a substrate holder immobilizing a substrate) to accelerate the ions toward the substrate.

When the bias voltage is applied at relatively large time scales (e.g. for a duration t greater than the reciprocal plasma frequency of the ions: $t \gg \omega_{pi}^{-1}$), a steady state Child-Langmuir sheath with sheath voltage $V_{DC}$ may be formed. For instance, bias voltage with a DC offset of $V_{DC}$ may be applied continuously at relatively large time scales or pulsed sufficiently rapidly so as to form the Child-Langmuir sheath to reach the steady state sheath condition.

After the Child-Langmuir sheath is formed under biasing conditions, the steady state sheath voltage $V_{DC}$ causes the ions of all species to bombard the substrate with energy near $eV_{DC}$ gained in the sheath (e.g. with some energies smaller due to possible collisions within the sheath). That is, rather than a significant spread of ion bombardment energy due to variation in start position of the ions, substantially all of the ions reaching the substrate are drawn into the Child-Langmuir sheath from the bulk plasma and fully accelerated by the sheath voltage $V_{DC}$ to reach the substrate with energy $eV_{DC}$. Further, as a result of the relatively large timescales, both $A^+$ and $B^+$ ions may reach the substrate at approximately the same energy (e.g. in absence of collisions in the sheath).

Yet the different species in the plasma may serve different purposes. For instance, species A may be a precursor gas and species B may be an inert gas. In some cases, preferentially providing ions of one species (e.g. less reactive ions $B^+$) to the substrate while decreasing or preventing ions of other species (e.g. more reactive ions $A^+$) from reaching the substrate may be beneficial. However, conventional plasma processes generally operate on timescales that form a voltage sheath at the interface between the plasma and a substrate. Therefore, conventional plasma processes cannot significantly differentiate the energies gained in the sheath for the ions of species A and B or their flux compositions.

The embodiment methods and plasma processing apparatuses described herein provide for selective separation of ions with different masses in the plasma sheath to facilitate selective ion bombardment (i.e. preferential energetic bombardment by ions of a targeted mass) from a single plasma volume. The selective separation and bombardment may advantageously enable advanced process control and improvements in process flexibility. For example, the embodiment methods and plasma processing apparatuses may beneficially minimize surface bombardment by energetic reactive species through appropriate process chemistry selection thereby leading to greater process selectivities.

Prior to the steady state formation of the sheath in response to external biasing conditions (e.g. external bias voltage $V_{DC}$), the interface between a plasma and electrode changes dynamically from a wall sheath (e.g. when not voltage is applied at a bias electrode) to the ion matrix and, finally to a Child law sheath. This dynamic intermediate phase represented by timescales shorter than the reciprocal plasma frequency of the ions ($t < \omega_{pi}^{-1}$) is characterized by an expanding matrix sheath that has been evacuated of electrons. Specifically, the initial application of negative voltage to the bias electrode repels the electrons from the region near the electrode leaving the ions in a matrix (e.g. because of the much greater mobility of electrons as compared to more massive ions).

In the so-called matrix sheath regime (e.g. times in the range $0 < t < \omega_{pi}^{-1}$), ions do not have enough time to fully traverse the width of the sheath. However, analogous to differences in mobility between massive ions and electrons, lighter (i.e. less massive) ion species have higher mobility and travel faster within the matrix sheath than heavier (i.e. more massive) ion species. Consequently, the less massive ions gain higher velocity, travel longer distances, passing through a higher potential difference. This can temporarily lead to higher ion energies and ion fluxes of the less massive ions at the bias electrode. At larger timescales (e.g. $t > \omega_{pi}^{-1}$), ions of all masses have sufficient time to reach the substrate and the matrix sheath continues to expand until a steady state Child-Langmuir sheath is formed ($t \gg \omega_{pi}^{-1}$).

It should be noted that reference to $\omega_{pi}^{-1}$ herein is intended to describe a qualitative timescale since the specific value is dependent on the ion mass. For the purposes of this disclosure, the lower bound of $\omega_{pi}^{-1}$ calculated using the least massive ion species can be assumed for the inequality $t < \omega_{pi}^{-1}$ while the upper bound calculated using the most massive ion species can be assumed for greater than inequalities such as $t \gg \omega_{pi}^{-1}$.

The embodiment methods and plasma processing apparatuses described herein generate plasma containing a first species and a second species that is less massive than the first species. The first species ions and second species ions are spatially stratified in the plasma sheath by applying a negative bias pulse to a bias electrode with pulse duration less than the reciprocal plasma frequency of the second species ions (e.g. less than 10 μs). For instance, in the matrix sheath regime, the flux and energy of ions of the second species at the substrate may be increased relative to the flux and energy of ions of the first species at the substrate (e.g. to greater than 50%, greater than 67%, and higher). The negative bias pulse is followed by a pulse delay during which no bias voltage is applied to the bias electrode for at least three times the pulse duration.

In various embodiments, multiple negative bias pulses and corresponding pulse delays are applied to the bias electrode as a pulse train to selectively deliver second species ions to the bias electrode (e.g. a substrate). The reactivity of the second species towards target materials on the substrate may be different (e.g. lower) than the reactivity of the first species towards the target materials. For example, the first species may be a precursor gas while the second species is an inert gas or both species may be precursor gases. The pulse train may be applied using a short pulse generator coupled to the bias electrode.

Embodiment methods and plasma processing apparatuses may advantageously provide various benefits over conventional methods and apparatuses. Short negative DC bias pulses applied to a bias electrode (e.g. a substrate) may advantageously achieve preferable bombardment of the substrate by lighter ions. This preferable bombardment has the additional advantage of not requiring any physical segregation of species within the plasma processing chamber (i.e. all species are fully mixed in a single volume simultaneously). In contrast, selective segregation of the ions at the electrode is advantageously achieved using differences in mobility due to differences in mass of the ions. Further, the ability to selectively provide a particular ion species at the electrode may be beneficially leveraged to selectively deliver ions of particular reactivity to the electrode (e.g. less reactive/non-reactive vs. more reactive).

The increased ability to control ions at the substrate may advantageously enable enhanced controllability and flexibility in new processes. For example, the benefit of improving etch process selectivity for various target materials may be achieved by reducing surface bombardment of reactive ions. A more massive species may advantageously be used as a source of reactive radicals while a less massive species may be used as a source of less reactive or non-reactive ions (e.g. substantially chemically neutral relative to substrate surface).

Additional flexibility in ion densities within the plasma may be enabled by increased ability to segregate ion species at the substrate. For instance, higher concentrations of reactive species may advantageously be included in the plasma processing chamber to increase the number of reactive radicals at the substrate while limiting concentrations of reactive ions. The matrix sheath current may also advantageously be higher than the steady state Child-Langmuir sheath current during the sheath transition.

Figure 1B:
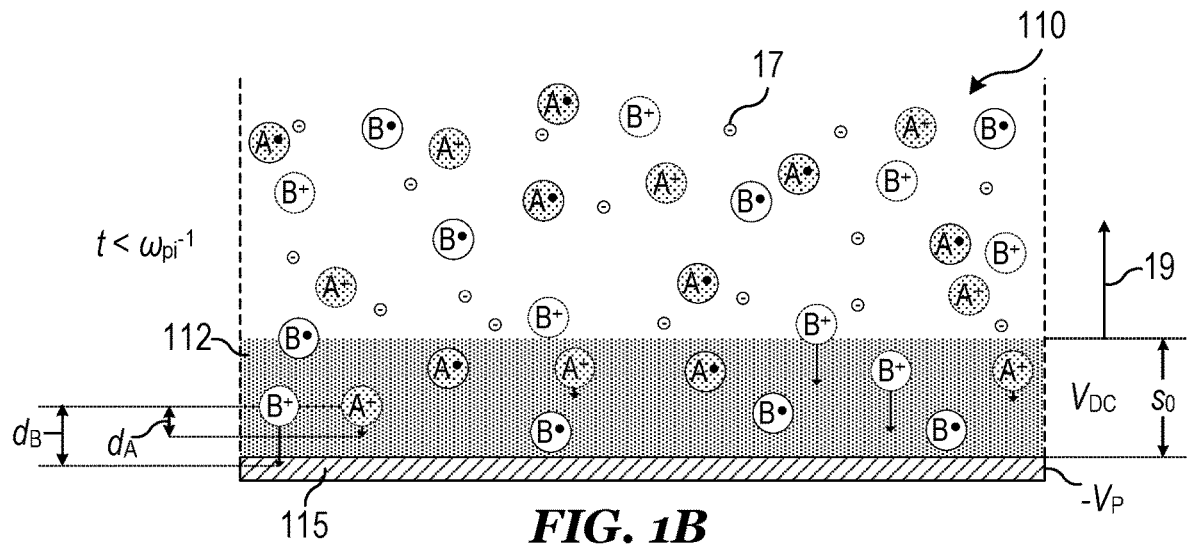
Figure 1C:
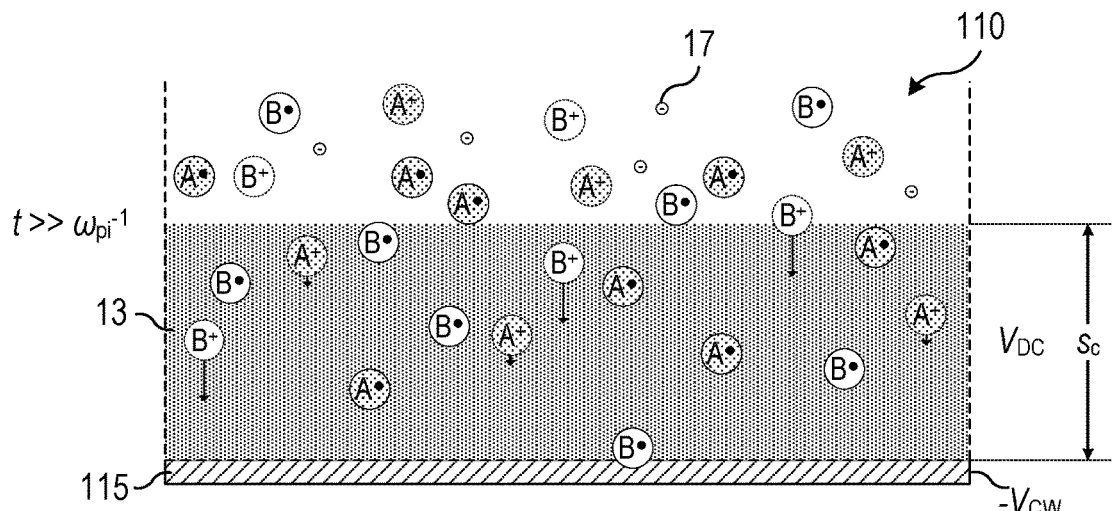
Figure 2:
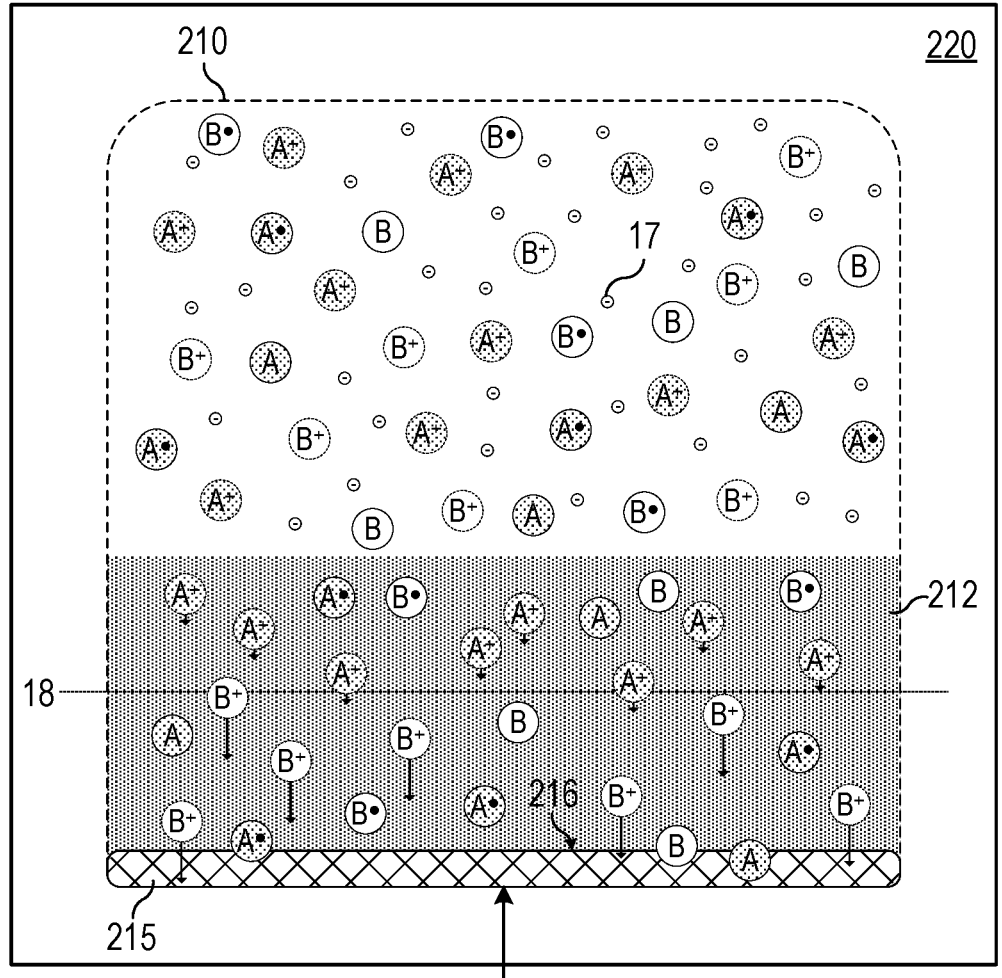
FIG. 2 schematically illustrates an example plasma processing apparatus including a matrix sheath of a plasma interfacing with a substrate within a plasma processing chamber, the substrate being coupled to a short pulse generator in accordance with an embodiment of the invention.

Embodiments provided below describe various apparatuses and methods for plasma processing, and in particular, apparatuses and methods for plasma processing in which ions of differing mass are spatially stratified in the plasma sheath. The following description describes the embodiments. FIGS. 1A, 1B, and 1C are used to describe an embodiment plasma in the presence of a bias electrode. FIG. 2 is used to describe an embodiment plasma processing apparatus. Three embodiment pulse trains are described using FIGS. 3-5. An embodiment continuous wave pulse train is described using FIG. 6 while an embodiment modulated wave pulse train is described using FIG. 7. Another embodiment plasma processing apparatus is described using FIG. 8. Two embodiment methods are described using FIGS. 9 and 10.

FIGS. 1A, 1B, and 1C schematically illustrate an example plasma in the presence of a bias electrode in accordance with an embodiment of the invention. FIG. 1A shows a wall sheath of the plasma interfacing with the bias electrode when no voltage is applied. FIG. 1B shows a matrix sheath of the plasma interfacing with the bias electrode when a pulsed voltage is applied. FIG. 1C shows a Child-Langmuir sheath of the plasma interfacing with the bias electrode when continuous DC voltage is applied.

Referring to FIGS. 1A, 1B, and 1C, a plasma 110 interfacing with a bias electrode 115 includes two species (species A and species B). Species A (e.g. the first species) is more massive than species B (e.g. the second species). Species A and B may also have different reactivity. That is, species A and B differ chemically and therefore may have different reactivities toward various materials included in a target substrate.

The plasma 110 includes ions $A^+$ and radicals $A^•$ generated from species A and ions $B^+$ and radicals $B^•$ generated from species B as well as electrons 17. Since the ions $A^+$ and $B^+$ are created due to the loss of one or more electrons (i.e. negligible mass), the mass relationship of ions $B^+$ being less massive than ions $A^+$ is maintained. The ions $A^+$ and $B^+$ are positively charged while the radicals $A^•$ and $B^•$ have no net electric charge. Further, the plasma 110 may include various additional dissociation products, additional precursors, carrier (e.g. inert, buffer) gases, additives, negatively charged ionic species, and others (not shown). Although present, source species A and B are not shown in the plasma 110 for clarity.

Referring now specifically to FIG. 1A, no external voltage is applied to the bias electrode 115 the voltage drop across the plasma sheath of the plasma 110 is small and abrupt resulting in a wall sheath 11. The wall sheath 11 is very thin having, for example, negligible sheath thickness (e.g. a couple of times the Debye length $\lambda_D$) in comparison to the sheath thickness in the presence of an applied voltage.

As shown in FIG. 1B, when a negative pulsed voltage $-V_P$ is applied to the bias electrode 115, the electrons 17 are immediately repelled by the negative potential $(-V_P)$ and move away from the bias electrode 115 expanding the plasma sheath to form a matrix sheath 112. For example, at timescales on the order of the reciprocal electron plasma frequency $\omega_{pe}^{-1}$, the ions $A^+$ and $B^+$ have moved a negligible distance due to $V_P$ while the electrons 17 have moved out of the matrix sheath 112. The matrix sheath 112 has a matrix sheath thickness so as measured from the bias electrode 115.

At timescales larger than $\omega_{pe}^{-1}$ the ions $A^+$ and $B^+$ are depleted from the sheath as they reach the bias electrode 115 and the matrix sheath 112 expands outward from the bias electrode 115 (illustrated by arrow 19). The voltage drop across the matrix sheath 112 is the difference between the plasma potential and the bias electrode potential: the sheath potential $V_{DC}$. Although the negative pulsed potential $V_P$ and the sheath potential $V_{DC}$ may be similar in many circumstances, they may also differ depending on the plasma potential.

For timescales of sufficient duration (i.e. $t \gg \omega_{pi}^{-1}$), the plasma sheath becomes a Child-Langmuir sheath 13 as shown in FIG. 1C. For example, a continuous negative DC voltage $-V_{CW}$ is applied to the bias electrode 115. That is, the magnitude of $V_P$ and $V_{CW}$ are not different, but the duration of the applied voltage is different resulting in the two regimes (matrix sheath regime vs. Child law regime). The voltage $-V_{CW}$ is continuous in the sense that it is sufficiently long to allow the plasma sheath to reach a steady state.

The Child-Langmuir sheath 13 has a Child-Langmuir sheath thickness $s_C$ as measured from the bias electrode 115. The matrix sheath thickness $s_0$ is smaller than $s_C$ (e.g. five times smaller). For example, the matrix sheath thickness may be on the order of a couple of millimeters (e.g. 2.3 mm).

In contrast, as shown in FIG. 1B, for times $t<\omega_{pi}^{-1}$ (e.g. the matrix sheath regime) the interface between the plasma 110 and the bias electrode 115 is highly dynamic. Initially, at $t=\omega_{pe}^{-1}$ the electron density in the matrix sheath 112 can be considered zero ($n_e=0$) while the ion density $n_i$ is constant because the ions $A^+$ and $B^+$ move much more slowly than the electrons 17.

Following the initial creation of the matrix sheath 112, the exposed ions $A^+$ and $B^+$ are drained from the matrix sheath 112 to the bias electrode 115. The potential within the matrix sheath 112 behaves quadratically. The ion energy distribution $E_i$ can be expressed by the potential distribution in the matrix sheath 112.

Each of the ions $A^+$ and $B^+$ arrive at the bias electrode 115 with a bombardment energy dependent on starting position within the matrix sheath 112. Specifically, if x is the starting position of an ion, the ion will arrive with energy $$eV_{DC}\left[1 - \frac{(s_0 - x)^2}{s_0^2}\right]$$

Hence, the bombardment energy of all the ions $A^+$ and $B^+$ is less than $eV_{DC}$ since the time t is less than the time it takes for either ion species to fully traverse the matrix sheath 112.

Due to the difference in ion mass between ions $A^+$ and $B^+$, the ions cross the plasma sheath at different velocities. The ion velocity ($v$) through the plasma sheath $s_0$ may be represented as:

$$v(x) = \sqrt{\frac{2eV_{DC}}{M_i}}\left[1 - \frac{(s_0 - x)^2}{s_0^2}\right]^{1/2}$$

The ion velocity also depends on the ion mass, $M_i$. Hence, the ions with lighter mass gain higher velocity through the plasma sheath than ions with heavier mass. Traveling longer distances and over a greater potential difference results in higher energies. As the result the lighter ions $B^+$ gain more energy and travel greater distances in a shorter time compared to the heavier ions $A^+$ (i.e. when both start at the same distance from the electrode).

As illustrated by $A^+$ travel distance $d_A$ and $B^+$ travel distance $d_B$, the lighter ions $B^+$ travel a greater distance in the same amount of time. Due to the increased mass of species A relative to species B, $d_B > d_A$. The difference between $d_A$ and $d_B$ increases with increased mass disparity. For example, for helium (He) and chlorine (Cl$_2$) which have masses of 4 amu (atomic mass units) and 70.9 amu respectively, an He$^+$ ion ($B^+$) may move about three times as far as a Cl$_2^+$ ion ($A^+$). However ratio of $d_B:d_A$ may be greater than or less than 3:1 (but always greater than 1:1) depending on the particular masses involved.

A further implication is that the less massive ions $B^+$ have higher mobility compared to the more massive ions $A^+$. The ions $A^+$ and $B^+$ in the matrix sheath 112 are depleted at different rates due to the difference in mobility. Therefore, the location of peak current will occur at a different time for ions of different masses (e.g. at ~50 ns for He$^+$). In this way, the creation of the matrix sheath 112 advantageously separates ions of different masses (ions $A^+$ and $B^+$) in the plasma sheath for times less than or comparable with the $B^+$ ion transit time through the sheath.

The current density $j_P$ in the matrix sheath 112 is dynamic and higher than the substantially constant Child-Langmuir current density $j_C$. For example, after the ions begin to move out of the matrix sheath 112 $j_P$ rapidly increases, peaks around $t \approx \omega_{pi}^{-1}$, and then rapidly decreases to a steady state in the Child law regime ($j_C$). As a consequence, $j_P$ may have the advantage of being higher than $j_C$ (e.g. 5 to 10 times higher or more).

At timescales shorter than $\omega_{pi}^{-1}$ for the lightest species, the disparity between the concentration of the ions $A^+$ and $B^+$ at the bias electrode 115 may advantageously be maximized since the current density of the $B^+$ ions peaks but the current density of the $A^+$ is far from peaking.

FIG. 2 schematically illustrates an example plasma processing apparatus including a matrix sheath of a plasma interfacing with a substrate within a plasma processing chamber, the substrate being coupled to a short pulse generator in accordance with an embodiment of the invention. The plasma processing apparatus of FIG. 2 may be used to generate embodiment plasmas as described herein, such as the plasma of FIGS. 1A, 1B, and 1C, for example. Similarly labeled elements may be as previously described.

Referring to FIG. 2, a plasma processing apparatus 200 includes plasma 210 contained within a plasma processing chamber 220. It should be noted that here and in the following a convention has been adopted for brevity and clarity wherein elements adhering to the pattern [x10] may be related implementations of plasma in various embodiments. For example, the plasma 210 may be similar to the plasma 110 except as otherwise stated. An analogous convention has also been adopted for other elements as made clear by the use of similar terms in conjunction with the aforementioned three-digit numbering system.

The plasma 210 includes a matrix sheath 212 generated by applying a bias voltage in the form of a negative pulsed voltage $-V_P$ delivered to a substrate 215 which may be a specific implementation of a bias electrode (e.g. immobilized by a substrate holder acting as a bias electrode). The substrate 215 includes a surface 216 exposed to the plasma 210 which interfaces with the substrate 215 at the matrix sheath 212. For example, the surface 216 is an etchable surface in one embodiment.

The negative pulsed voltage $-V_P$ is generated by a short pulse generator 222 coupled to the substrate 215 (e.g. via a substrate holder). As shown, the short pulse generator delivers at least one negative voltage pulse of duration less than the reciprocal ion plasma frequency ($t < \omega_{pi}^{-1}$). The negative voltage pulse is followed by a pulse delay that of sufficient duration to allow the plasma 210 recover (e.g. return to a wall sheath state). In various embodiments, the negative voltage pulse and pulse delay are cyclically repeated as a pulse train of appropriate length for the desired processing of the surface 216.

Still referring to FIG. 2, the plasma 210 as shown includes species A and species B as well as corresponding ions $A^+$ and $B^+$ and radicals $A^•$ and $B^•$. As before, many other species such as dissociation products, additives, etc. may also be present in the plasma 201. In various embodiments, the species B and its derivatives are less reactive than species A and its derivatives. For this reason species A may sometimes be referred to as a reactive species while species B may be referred to as a non-reactive species herein. However, it is also possible for species B to be more reactive than species A when reactive ions are desired at the substrate 215.

In various embodiments species A is a precursor gas and is tetrafluoromethane (carbon tetrafluoride, $CF_4$) in one embodiment. Species A may also be a hydrofluorocarbon ($C_xH_yF_z$) in various embodiments. In another embodiment, species A is chlorine gas ($Cl_2$). In still another embodiment, species A is hydrogen bromide (HBr). Of course, other precursors are also possible and may depend on the specific details of the desired plasma process being performed. In some cases a heavy inert gas may be used for species A, such as if reactive ions are desired at the substrate 215.

Species B may be an inert gas or precursor gas that is less massive than species A. In some embodiments, species B is an inert gas and is helium gas (He) in one embodiment. Other possible inert gases may also be used as species B such as neon gas (Ne), argon gas (Ar), and others (although increased species B mass limits available more massive species for A). In other embodiments, species B is a precursor gas. In one embodiment, species B is hydrogen gas ($H_2$). In another embodiment, species B is oxygen gas ($O_2$).

The negative bias voltage $-V_P$ spatially stratifies the ions $A^+$ and $B^+$ in the plasma sheath (matrix sheath 212). For example, as illustrated by qualitative stratification line 18, at a time $t<\omega_{pi}^{-1}$ the $B^+$ ions have moved to the bottom of the matrix sheath 212 while the $A^+$ remain at the top of the matrix sheath 212. In this way, a small number of $A^+$ ions that were initially close to the substrate 215 impinge on the surface 216 while a large number of $B^+$ ions reach the surface 216. The flux of $B^+$ ions is therefore advantageously increased at the substrate 215.

The electrically neutral species A, B, $A^{\bullet}$, and $B^{\bullet}$ are unaffected by the applied voltage $-V_P$. Consequently, the concentration of radicals $A^{\bullet}$ and $B^{\bullet}$ at the substrate 215 remains the same. For example, species A may be a etchant source with the $A^{\bullet}$ radicals being desirable as etchants at the surface 216 while reactive $A^+$ ions are undesirable at the surface 216. The increased flux of $B^+$ ions at the substrate 215 preferentially bombards the surface 216 with $B^+$ ions at a higher energy than the $A^+$ ions.

This, in turn, may advantageously increase selectivity in etch processes. For many processes, selectivity may be defined as a ratio of the flux of reactive radicals to the flux of reactive ions. Consequently, surface bombardment by reactive ions may be unwanted as it may result in selectivity loss. Species A, with greater mass (i.e. heavier molecular/atomic weight) can be used as a source of reactive radicals whereas species B can be used as the source of non-reactive ions.

Electric field modulation in the plasma sheath by short bias pulses may advantageously lead to preferable surface bombardment by more energetic non-reactive ions $B^+$ while electrically neutral reactive radicals $A^{\bullet}$ are used as the main etchant improving the etch selectivity.

In various embodiments, a plasma etching process includes a halogen-based precursor gas as species A and an inert gas as species B. Unwanted surface bombardment by halogen ions may be reduced or eliminated by supplying short pulse biases to a substrate. In one embodiment, the species A is $CF_4$ and species B is an inert gas. For example, the inert gas may be He, Ar, and others. $CF_x^+$ ion bombardment may be advantageously minimized while inert ions (e.g. $He^+$ ions) may perform ion assisted etching in the fluoro-containing plasma.

Many other possible combinations of halogen-based precursor gases and inert gases exist. In another embodiment, species A is $CL_2$ and species B is He. In still other embodiments, species A is hydrogen bromide (HBr) while species B is an inert gas such as He or Ar.

Species A and species B may also both be precursor gases (e.g. with or without an additional inert gas). In various embodiments, species A is a halogen-based precursor gas while species B is a non-halogen-based precursor gas. For example, in one embodiment, species A is hydrogen chloride (HCl) and species B is hydrogen gas ($H_2$). In this example, bombardment of a substrate by $H^+$ ions may be preferred (e.g. for ion assisted etching).

In $C_xH_yF_z$ plasmas, the carbon to fluoride ratio (C:F) may be altered be appropriate selection of x, y, and z as well as with additives such as $O_2$ or $H_2$. Several species of different masses may be present in such a system. It may be advantageous to limit unwanted surface bombardment by fluorine-containing species (e.g. $C_xF_y$). Segregation of ions of different mass is not limited to binary cases of species A and species B, but may be extended to include as many species as may be in a given plasma. For example, a $C_xH_yF_z$ plasma may include several less-massive non-halogen-based species that may all be preferentially delivered to a substrate surface over fluorine-containing species.

It should be noted that although the examples herein refer to the preferential bombardment of a surface by higher energy ions of single lighter species relative to a single heavier ionic species, more than two ions may be included. For example, ions $A^+$, $B^+$, $C^+$, etc. having different masses may be included and the least massive ions $B^+$ with higher energy may preferentially bombard the surface. Further, a subset (e.g. one or more) of the ions may be targeted to preferentially bombard the surface with higher energy. For instance, the negative bias voltage $V_P$ may be applied for a sufficient amount of time to generate an increase in flux of the two lightest ionic species of several ionic species.

FIGS. 3-7 illustrate various pulse trains which may be applied to a bias electrode in order to generate a plasma with a matrix sheath and selectively segregate ions of differing mass from one another. The pulse trains of FIGS. 3-7 may be used to generate plasma using plasma processing apparatuses as described here such as the plasma processing apparatus of FIG. 2, for example. Similarly labeled elements may be as previously described.

The various pulse trains include negative bias pulses with a pulse duration $t_P$ sufficiently short so as to prevent Child law plasma behavior ($t_P<\omega_{pi}^{-1}$). In various embodiments, the pulse duration $t_P$ is in the range of tens of nanoseconds to tens of microseconds. In some embodiments, the pulse duration $t_P$ is less than about 100 ns and is about 75 ns in one embodiment. The specific values of the pulse duration to will depend in the operating conditions of a specific implementation. In one embodiment, the negative bias pulses are DC bias pulses. Alternatively, the pulse trains may be generated by modulating RF power.

Each negative bias pulse is followed by a corresponding pulse delay $t_{off}$ during which no bias voltage is applied to the bias electrode and of sufficient length ($t_{off}>>\omega_{pi}^{-1}$) to allow the plasma to recover from the negative bias pulse (e.g. regain a substantially consistent distribution of species in the plasma and form a wall sheath). The pulse delay $t_{off}$ is several multiples of $t_P$ in length (e.g. 3, 5, and higher). In various embodiments, the pulse delay $t_{off}$ is greater than about 150 ns and is about 375 ns in one embodiment. In other embodiments, the pulse delay $t_{off}$ may range from tens of nanoseconds to milliseconds.

Each of the negative bias pulses also has a pulse amplitude $V_P$ that alters the voltage drop across the plasma sheath and accelerates ions towards the bias electrode. The pulse amplitude $V_P$ may be any suitable voltage as may be desirable for a given plasma process and target substrate. In various embodiments, the pulse amplitude $V_P$ is less than about 500 V and is between about 25 V and about 150 V in some embodiments. In one embodiment, the pulse amplitude $V_P$ is about 50 V. In another embodiment, the pulse amplitude $V_P$ is about 100 V.

Figure 3:
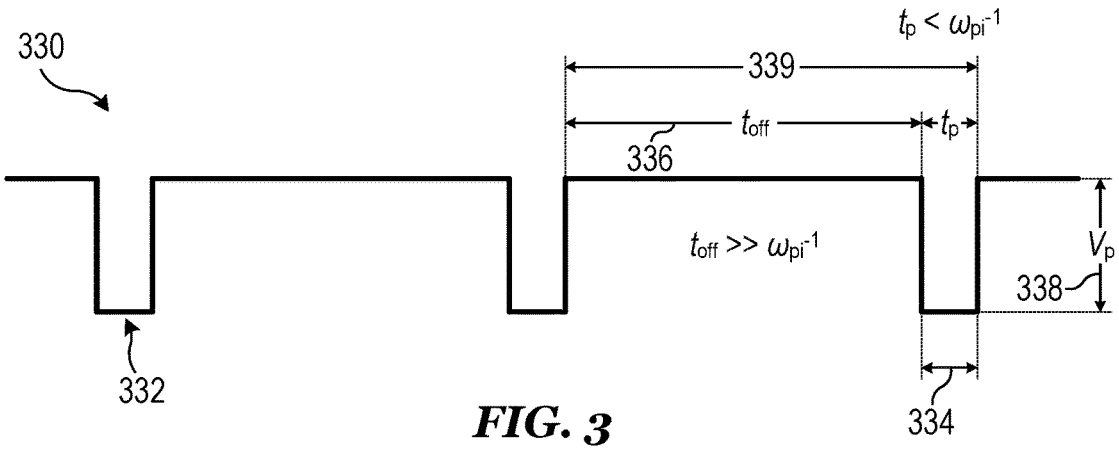
FIG. 3 illustrates an example pulse train of negative bias pulses in accordance with an embodiment of the invention.

FIG. 3 illustrates an example pulse train of negative bias pulses in accordance with an embodiment of the invention. Referring to FIG. 3, a pulse train 330 includes negative bias pulses 332 with pulse duration 334 ($t_P$) and pulse amplitude 338 ($V_P$) followed by a pulse delay 336 ($t_{off}$). The pulse train 330 includes a period 339, as shown. The application of a negative bias pulse followed by a pulse delay is repeated cyclically as needed. Although the pulse duration 334 and the pulse delay 336 are illustrated as remaining constant, it is also possible to dynamically vary these parameters while still maintaining the relationship with the ion plasma frequency ($t_P < \omega_{pi}^{-1} \ll t_{off}$).

Figure 4:
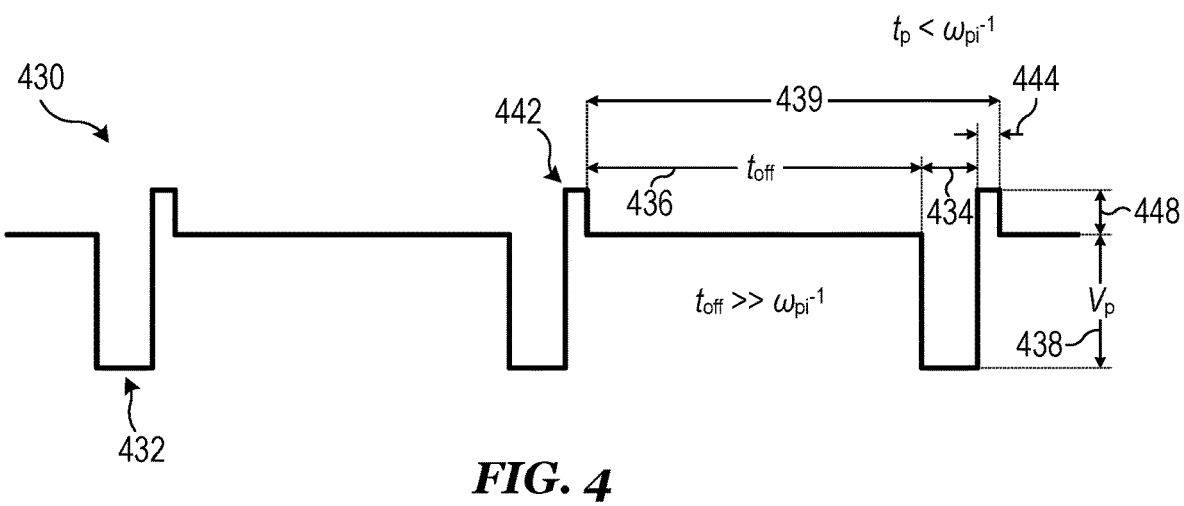
FIG. 4 illustrates an example pulse train of negative bias pulse and positive bias pulse in accordance with an embodiment of the invention.

FIG. 4 illustrates an example pulse train of negative bias pulse and positive bias pulse in accordance with an embodiment of the invention. Referring to FIG. 4, a pulse train 430 includes negative bias pulses 432 with negative pulse duration 434 ($t_P$) and negative pulse amplitude 438 ($V_P$) followed by a pulse delay 436 ($t_{off}$). The pulse train 430 includes a period 439, as shown. Additionally, the pulse train 430 also includes positive bias pulse 442 with positive pulse duration 444 and positive pulse amplitude 448.

The positive bias pulses 442 may be used to advantageously impart a force on the plasma electrons directed toward the bias electrode for faster sheath recovery after each of the negative bias pulses 432. Both the positive pulse duration 444 and positive pulse amplitude 448 may be smaller than the negative pulse duration 434 and the negative pulse amplitude 438 as shown, but this is not a requirement. In some cases the positive pulse duration 444 and positive pulse amplitude 448 may be appropriately chosen in order to advantageously accelerate electrons from the bulk plasma into the matrix sheath to allow faster recovery of the sheath.

Figure 5:
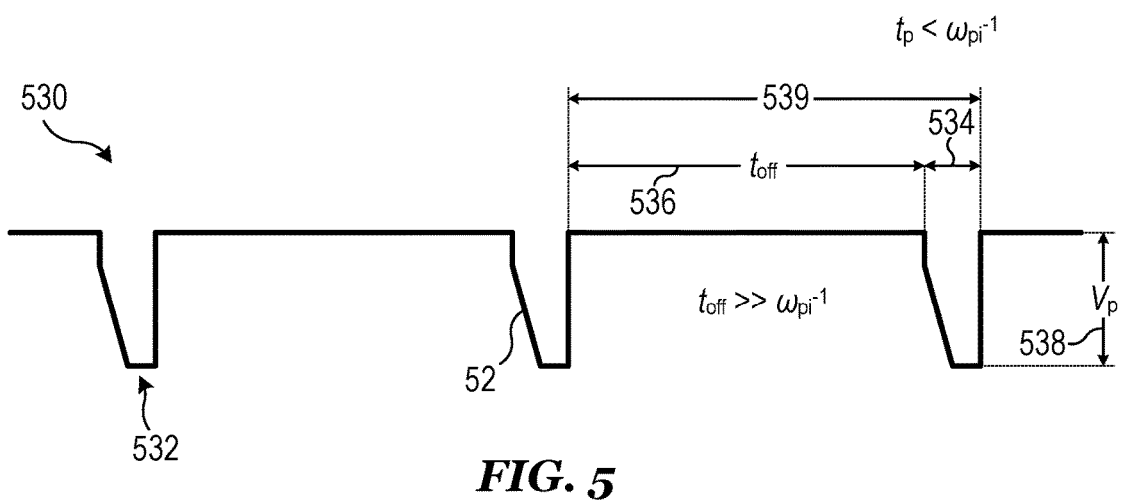
FIG. 5 illustrates an example pulse train of negative bias pulses, each with a linear voltage slope in accordance with an embodiment of the invention.

FIG. 5 illustrates an example pulse train of negative bias pulses, each with a linear voltage slope in accordance with an embodiment of the invention. Referring to FIG. 5, a pulse train 530 includes negative bias pulses 532 with pulse duration 534 ($t_P$) and pulse amplitude 538 ($V_P$) followed by a pulse delay 536 ($t_{off}$). The pulse train 530 includes a period 539, as shown. In contrast to the square wave shape of the negative bias pulses of FIG. 3, the negative bias pulses 532 of FIG. 5 include a linear voltage slope 52 which may have the advantage of reducing or minimizing adverse charging effects at the bias electrode (e.g. a substrate including dielectric material).

Figure 6:
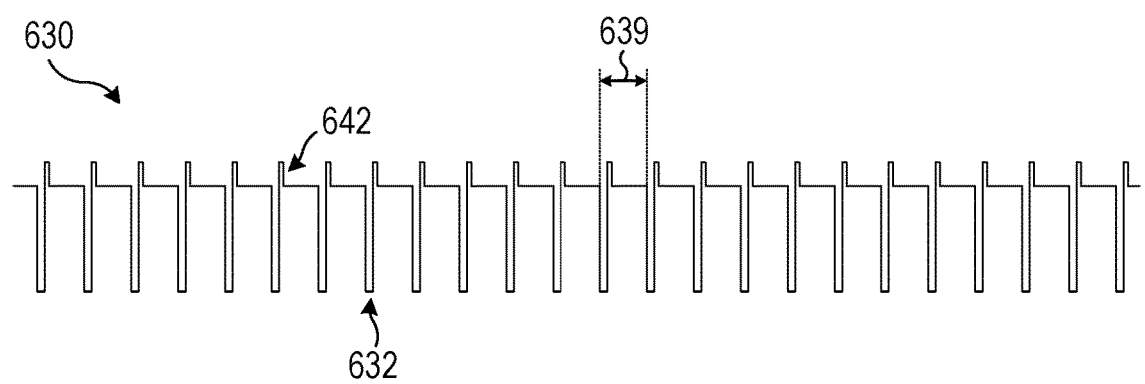
FIG. 6 illustrates an example continuous wave pulse train including negative bias pulses and positive bias pulses in accordance with an embodiment of the invention.

FIG. 6 illustrates an example continuous wave pulse train including negative bias pulses and positive bias pulses in accordance with an embodiment of the invention. Referring to FIG. 6, a continuous wave pulse train 630 includes negative bias pulses 632 and positive bias pulses 642 followed by a pulse delay. As shown, the application of a negative bias pulse followed by a pulse delay is repeated cyclically with period 639 for many cycles without disruption. The continuous wave pulse train 630 may be a specific implementation of other pulse trains described herein such as the pulse train 330 of FIG. 3 as well as the pulse trains of FIGS. 4-5.

Figure 7:
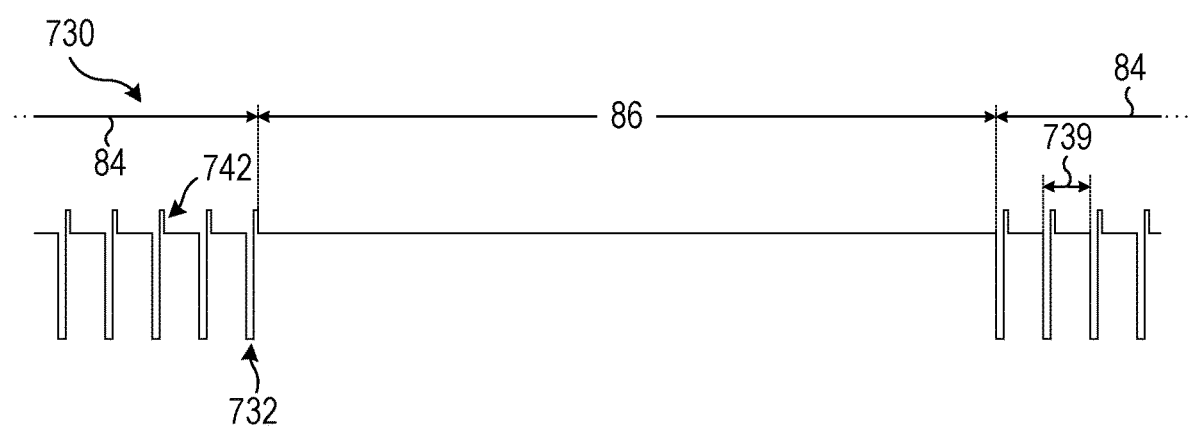
FIG. 7 illustrates an example modulated wave pulse train including a surface reaction phase followed by a chemical modification phase in accordance with an embodiment of the invention.

FIG. 7 illustrates an example modulated wave pulse train including a surface reaction phase followed by a chemical modification phase in accordance with an embodiment of the invention. Referring to FIG. 7, a modulated wave pulse train 730 includes negative bias pulses 732 and positive bias pulses 742 followed by a pulse delay repeated cyclically with period 739. Different from the continuous wave pulse train 630 of FIG. 6, the modulated wave pulse train 730 includes a surface reaction phase 84 followed by a chemical modification phase 86 during which no pulses are generated.

The surface reaction phase 84 may leverage the relatively short timescale of surface reactions to process the surface of a substrate during negative bias pulses. In contrast, the chemical modification phase 86 may be sufficiently long so as to allow the relatively long timescale of surface restoration processes to take effect. For example, the chemical modification phase 86 may be a chemistry adsorption phase.

It should be noted that some or all of the features described using FIGS. 3-7 may be combined. For example, both positive bias pulses and negative bias pulse with a linear voltage slope may be implemented in the same pulse train generated by modulating RF power. Further, a surface reaction phase may be included in a pulse train utilizing a linear voltage slope but not implementing positive bias pulses. Other combinations will be apparent to those of skill in the art in view of the totality of the disclosure.

Figure 8:
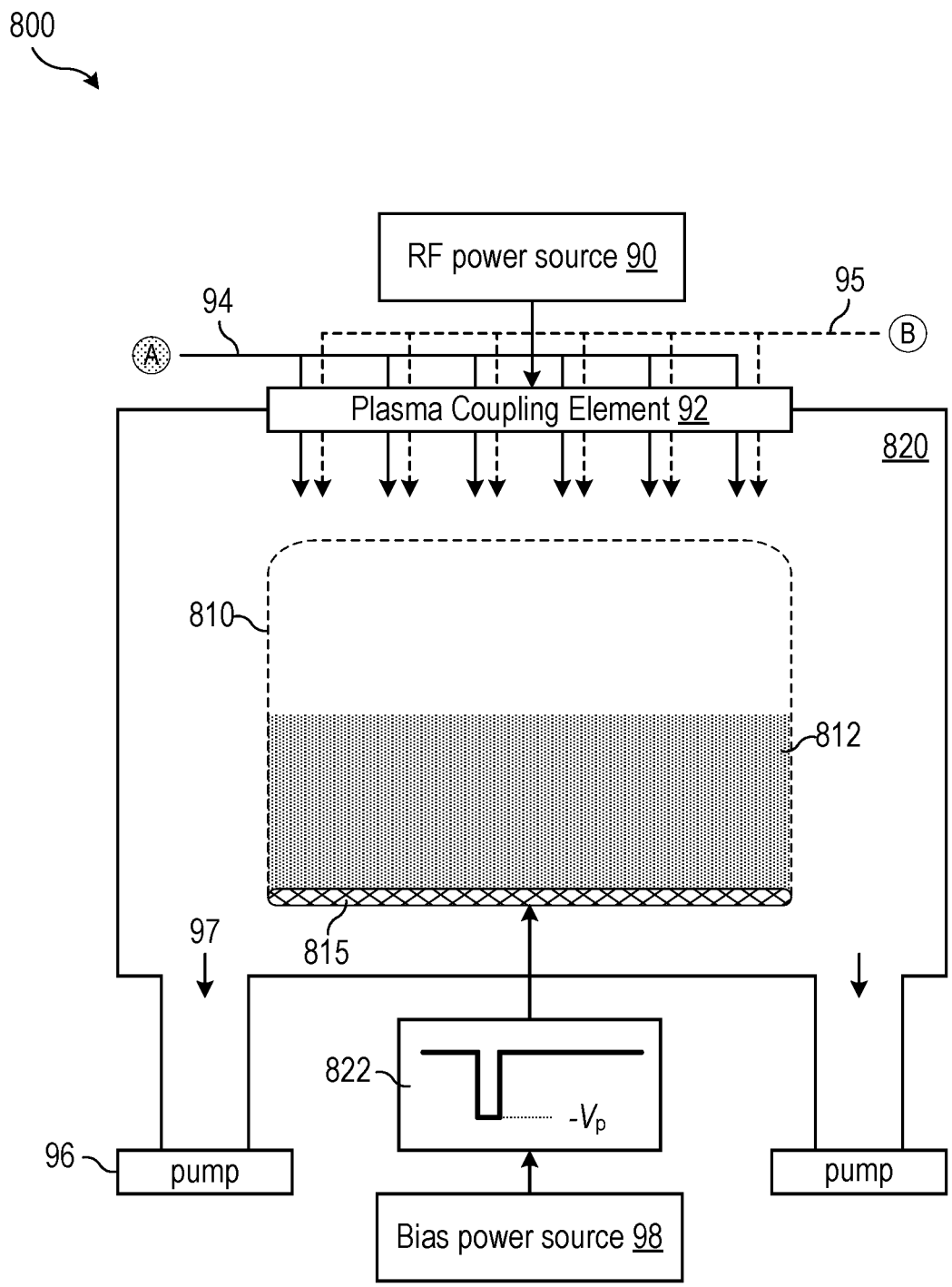
FIG. 8 schematically illustrates an example plasma processing apparatus including a plasma coupling element used to generate a plasma, a first gas source, a second gas source, and a substrate within a plasma processing chamber, the plasma including a matrix sheath interfacing with the substrate which is coupled to a short pulse generator in accordance with an embodiment of the invention.

FIG. 8 schematically illustrates an example plasma processing apparatus including a plasma coupling element used to generate a plasma, a first gas source, a second gas source, and a substrate within a plasma processing chamber, the plasma including a matrix sheath interfacing with the substrate which is coupled to a short pulse generator in accordance with an embodiment of the invention. The plasma processing apparatus of FIG. 8 may be a specific implementation of other plasma processing apparatuses described herein such as the plasma processing apparatus of FIG. 2, for example. Similarly labeled elements may be as previously described.

Referring to FIG. 8, a plasma processing apparatus 800 includes plasma 810 contained within a plasma processing chamber 820. The plasma 810 is generated using an RF power source 90 coupled to a plasma coupling element 92 and includes a matrix sheath 812, the plasma 810 with the matrix sheath 812 being similar to other plasmas described herein. A negative pulsed voltage $V_P$ is applied to a substrate 815 by way of a short pulse generator 822 coupled to the substrate 815 and supplied by a bias power source 98.

The plasma 810 may an RF plasma as illustrated or may be any other suitable type of plasma. For example, the plasma 810 may be a capacitively coupled plasma (CCP), an inductively coupled plasma (ICP), a surface wave plasma (SWP), electron cyclotron resonance (ECR) plasma, helical resonator (HR) plasma, and others. The specific implementation of the plasma coupling element 92 may depend on the plasma 810. In one embodiment, the plasma 810 is a CCP plasma and the plasma coupling element 92 is an upper electrode. In other embodiments, the plasma 810 is an ICP plasma and the plasma coupling element 92 is a coil or an antenna that couples source power to the plasma 810 through a dielectric material of the plasma processing chamber 820.

As before, the plasma 810 includes at least two species: A and B which may be delivered using a species A source gas 94 and a species B source gas 95 (e.g. through a showerhead at the top of the plasma processing chamber 820 or through other suitable means). For example, gas inlets may also be included in walls of the plasma processing chamber 820. In some embodiments, the plasma coupling element 92 may also be a showerhead with multiple gas inlets to even distribute the delivery of species A and species B into the plasma processing chamber 820. Alternatively, (e.g. for ICP plasmas), a dielectric gas delivery system may also be used.

The gas within the plasma processing chamber 820 is evacuated using one or more vacuum pumps 96, such as a single stage pumping system or a multistage pumping system (e.g. a mechanical roughing pump combined with one or more turbomolecular pumps). For example, vacuum pumps 96 may be configured to remove gas from the plasma processing chamber 820 through on or more gas outlets 97. In order to promote even gas flow during plasma processing, gas may be removed from more than one gas outlet or location in the plasma processing chamber 820 (e.g. on opposite sides of the substrate 815, a ring around the substrate 815, etc.)

The pressure within the plasma processing chamber 820 may be controlled using gas flowrates of the species A source gas 94 and species B source gas 95 while gas is pumped out of the system using the vacuum pumps 96. Absolute and relative ion densities of the different species (A, B, etc.) affect the concentration of reactive ions at the substrate. The ion densities may advantageously be controlled using gas flowrates of the species A source gas 94 and species B source gas 95 to further improve selectivity of a given plasma process.

Figure 9:
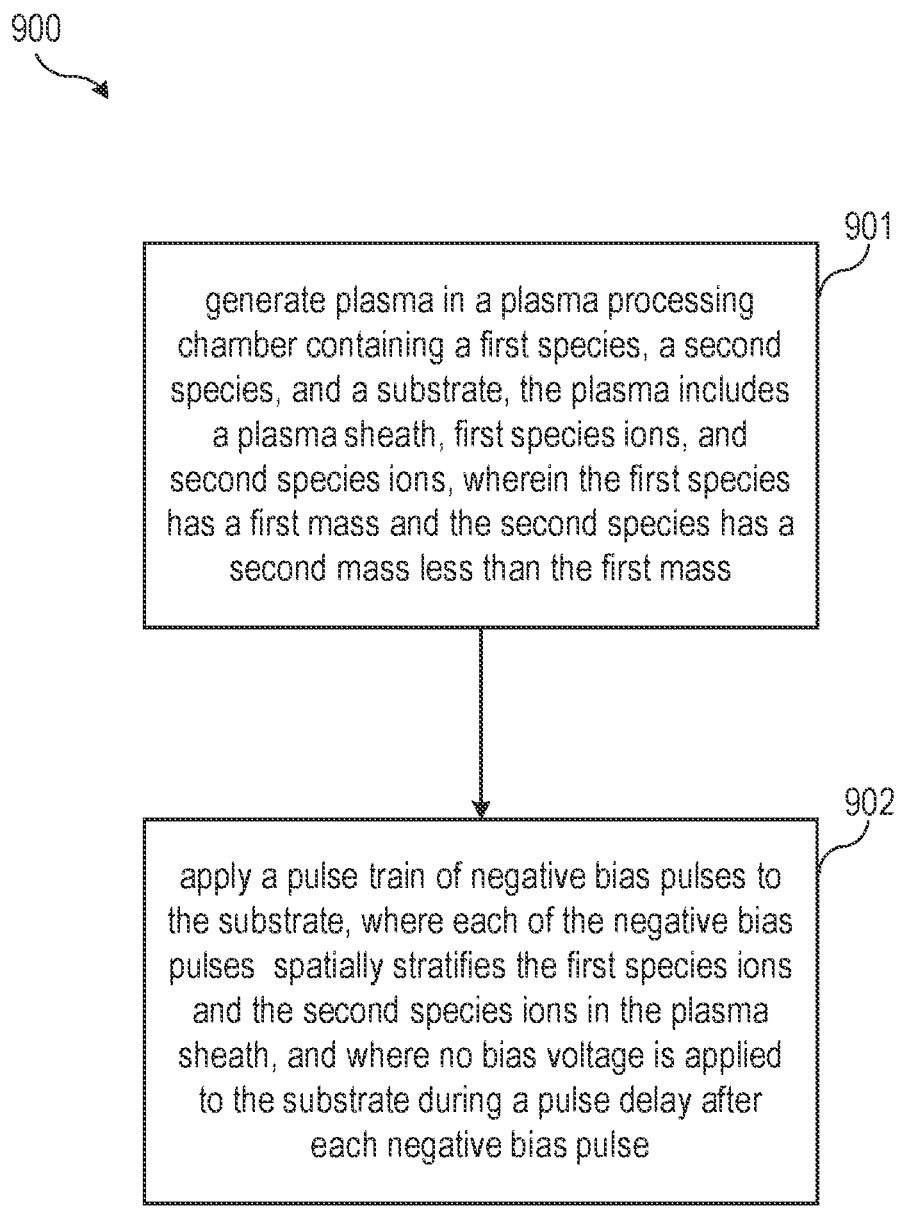
FIG. 9 illustrates an example method of plasma processing in accordance with an embodiment of the invention.

FIG. 9 illustrates an example method of plasma processing in accordance with an embodiment of the invention. The method of FIG. 9 may be performed using the plasma processing apparatuses, plasmas, and pulse trains as described herein. For example, the method of FIG. 9 may be combined with any of the embodiments of FIGS. 1-8. Although shown in a logical order, the arrangement and numbering of the steps of FIG. 9 are not intended to be limited. The method steps of FIG. 9 may be performed in any suitable order or concurrently with one another as may be apparent to a person of skill in the art.

Referring to FIG. 9, step 901 of a method goo of plasma processing is to generate plasma in a plasma processing chamber. The plasma processing chamber contains a first species, a second species, and a substrate. The plasma generated in the plasma processing chamber includes a plasma sheath, first species ions, and second species ions. The first species has a first mass and the second species has a second mass less than the first mass.

Step 902 is to apply a pulse train of negative bias pulses to the substrate. Each of the negative bias pulses spatially stratifies the first species ions and the second species ions in the plasma sheath. The duration of each of the negative bias pulses is less than 10 µs in various embodiments and is less than 1 µs in some embodiments. No bias voltage is applied to the substrate during a pulse delay after each negative bias pulse. In various embodiments, the pulse delay is at least three times the pulse duration and is at least five times the pulse duration in some embodiments.

Figure 10:
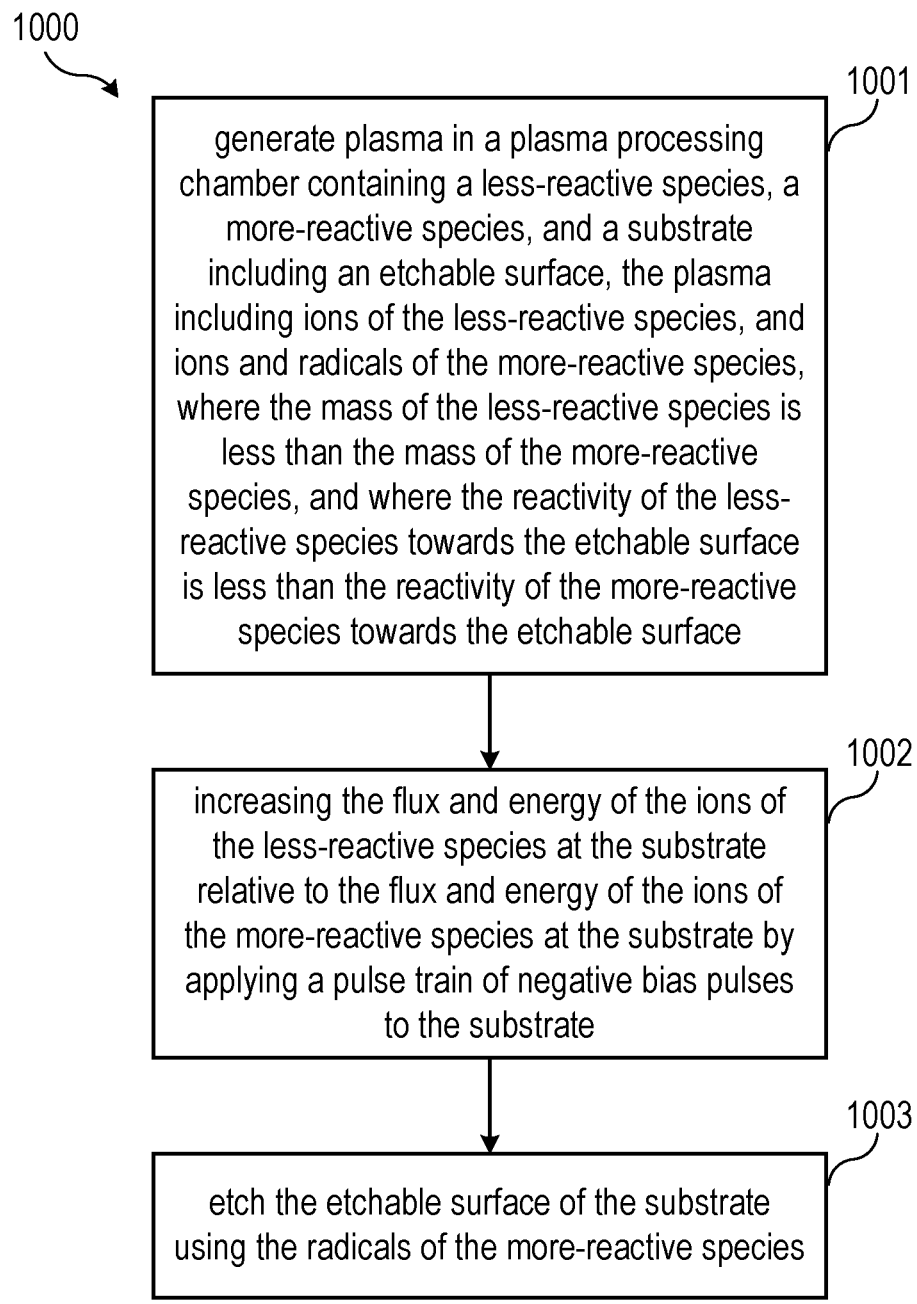
FIG. 10 illustrates another example method of plasma processing in accordance with an embodiment of the invention.

FIG. 10 illustrates another example method of plasma processing in accordance with an embodiment of the invention. The method of FIG. 10 may be performed using the plasma processing apparatuses, plasmas, and pulse trains as described herein. For example, the method of FIG. 10 may be combined with any of the embodiments of FIGS. 1-8. Additionally, the method of FIG. 10 may be combined with other methods such as the method of FIG. 9, for example. Although shown in a logical order, the arrangement and numbering of the steps of FIG. 10 are not intended to be limited. The method steps of FIG. 10 may be performed in any suitable order or concurrently with one another as may be apparent to a person of skill in the art.

Referring to FIG. 10, step 1001 of a method 1000 of plasma processing is to generate plasma in a plasma processing chamber containing a less-reactive species, a more-reactive species, and a substrate that includes an etchable surface. The plasma includes ions of the less-reactive species, and ions and radicals of the more-reactive species. The mass of the less-reactive species is less than the mass of the more-reactive species. The reactivity of the less-reactive species towards the etchable surface is less than the reactivity of the more-reactive species towards the etchable surface.

Step 1002 is to increase the flux and energy of the ions of the less-reactive species at the substrate relative to the flux and energy of the ions of the more-reactive species at the substrate by applying a pulse train of negative bias pulses to the substrate. The duration of each of the negative bias pulses is less than 10 µs in various embodiments. The etchable surface of the substrate is etched using radicals of the more-reactive species in step 1003.

Example embodiments of the invention are summarized here. Other embodiments can also be understood from the entirety of the specification as well as the claims filed herein.

Example 1. A method of plasma processing including: generating plasma in a plasma processing chamber containing a first species, a second species, and a substrate, the plasma including a plasma sheath, first species ions, and second species ions, where the first species has a first mass and the second species has a second mass less than the first mass; and applying a pulse train of negative bias pulses to the substrate, where each of the negative bias pulses has a pulse duration less than 10 µs and spatially stratifies the first species ions and the second species ions in the plasma sheath, and where no bias voltage is applied to the substrate during a pulse delay after each negative bias pulse, the pulse delay being at least five times the pulse duration.

Example 2. The method of example 1, where the first species is a precursor gas and the second species is an inert gas.

Example 3. The method of one of examples 1 and 2, where the first species is a first precursor gas and the second species is a second precursor gas.

Example 4. The method of one of examples 1 to 3, where the pulse duration is less than about 250 ns.

Example 5. The method of one of examples 1 to 4, where the pulse delay is greater than about 10 µs.

Example 6. The method of one of examples 1 to 5, where the reactivity of the first species towards an etchable surface of the substrate is greater than the reactivity of the second species towards the etchable surface of the substrate.

Example 7. The method of one of examples 1 to 6, further including: etching the substrate using first species radicals.

Example 8. The method of one of examples 1 to 7, where repeating the steps further includes: applying a positive bias pulse after each of the negative bias pulses and before each pulse delay.

Example 9. The method of one of examples 1 to 8, where a leading edge of each of the negative bias pulses includes a linear voltage slope.

Example 10. The method of one of examples 1 to 9, further including: after applying the pulse train for a first duration, performing a chemical modification phase by applying no bias voltage to the substrate for a second duration greater than ten times the sum of the pulse duration and the pulse delay; and after the chemical modification phase, resume applying the pulse train for a third duration.

Example 11. A method of plasma processing including: generating plasma in a plasma processing chamber containing a less-reactive species, a more-reactive species, and a substrate including an etchable surface, the plasma including ions of the less-reactive species, and ions and radicals of the more-reactive species, where the mass of the less-reactive species is less than the mass of the more-reactive species, and where the reactivity of the less-reactive species towards the etchable surface is less than the reactivity of the more-reactive species towards the etchable surface; increasing the flux and energy of the ions of the less-reactive species at the substrate relative to the flux and energy of the ions of the more-reactive species at the substrate by applying a pulse train of negative bias pulses to the substrate, each negative bias pulse having a pulse duration less than 10 µs; and etching the etchable surface of the substrate using the radicals of the more-reactive species.

Example 12. The method of example 11, where the less-reactive species is an inert gas and the more-reactive species is a precursor gas.

Example 13. The method of example 12, where the inert gas is helium and the precursor gas is a fluorocarbon.

Example 14. The method of one of examples 11 to 13, where the less-reactive species is a first precursor gas and the more-reactive species is a second precursor gas.

Example 15. The method of example 14, where the first precursor gas is hydrogen ($H_2$) and the second precursor gas is hydrogen chloride (HCl).

Example 16. The method of one of examples 11 to 15, where a pulse delay between successive negative bias pulses is at least five times the pulse duration.

Example 17. A plasma processing apparatus including: a plasma processing chamber configured to contain a plasma including a plasma sheath, ions of a first species, and ions of a second species, where the first species has a first mass and the second species has a second mass less than the first mass; a substrate disposed in the plasma processing chamber; and a short pulse generator coupled to the substrate, the short pulse generator configured to generate a pulse train of negative bias pulses, where each of the negative bias pulses has a pulse duration less than 10 µs, where a pulse delay between successive negative bias pulses is at least five times the pulse duration, and the pulse train spatially stratifies the ions of the first species and the ions of the second species in the plasma sheath.

Example 18. The plasma processing apparatus of example 17, where the pulse duration is less than about 250 ns.

Example 19. The plasma processing apparatus of one of examples 17 and 18, where the pulse delay is greater than about 10 µs.

Example 20. The plasma processing apparatus of one of examples 17 to 19, where the pulse train further includes positive bias pulses immediately following each of the negative bias pulses, the pulse delay between successive negative bias pulses immediately following each of the positive bias pulse. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of plasma processing comprising:
generating plasma in a plasma processing chamber containing a first species, a second species, and a substrate, the plasma comprising a plasma sheath, first species ions, and second species ions, wherein the first species has a first mass and the second species has a second mass less than the first mass; and
applying a pulse train of negative bias pulses to the substrate,
wherein each of the negative bias pulses has a pulse duration less than 10 µs and spatially stratifies the first species ions and the second species ions in the plasma sheath, and
wherein no bias voltage is applied to the substrate during a pulse delay after each negative bias pulse, the pulse delay being at least five times the pulse duration.

2. The method of claim 1, wherein the first species is a precursor gas and the second species is an inert gas.

3. The method of claim 1, wherein the first species is a first precursor gas and the second species is a second precursor gas.

4. The method of claim 1, wherein the pulse duration is less than about 250 ns.

5. The method of claim 1, wherein the pulse delay is greater than about 10 µs.

6. The method of claim 1, wherein a reactivity of the first species towards an etchable surface of the substrate is greater than a reactivity of the second species towards the etchable surface of the substrate.

7. The method of claim 1, further comprising:
etching the substrate using first species radicals.

8. The method of claim 1, wherein repeating the steps further comprises:
applying a positive bias pulse after each of the negative bias pulses and before each pulse delay.

9. The method of claim 1, wherein a leading edge of each of the negative bias pulses comprises a linear voltage slope.

10. The method of claim 1, further comprising:
after applying the pulse train for a first duration, performing a chemical modification phase by applying no bias voltage to the substrate for a second duration greater than ten times the sum of the pulse duration and the pulse delay; and
after the chemical modification phase, resume applying the pulse train for a third duration.

11. A method of plasma processing comprising:
generating plasma in a plasma processing chamber containing a first species, a second species, and a substrate comprising an etchable surface, the plasma comprising a plasma sheath, first species ions, first species radicals, and second species ions,
wherein the first species has a first mass and the second species has a second mass less than the first mass, and
wherein a reactivity of the second species towards the etchable surface is less than a reactivity of the first species towards the etchable surface; and
applying a pulse train of negative bias pulses to the substrate,
wherein each of the negative bias pulses has a pulse duration less than 10 µs and spatially stratifies the first species ions and the second species ions in the plasma sheath, wherein no bias voltage is applied to the substrate during a pulse delay after each negative bias pulse, the pulse delay being at least five times the pulse duration, and wherein applying the pulse train increases the flux and energy of the second species ions at the substrate relative to the flux and energy of the first species ions at the substrate.

12. The method of claim 11, wherein the second species is an inert gas and the first species is a precursor gas.

13. The method of claim 12, wherein the inert gas is helium and the precursor gas is a fluorocarbon.

14. The method of claim 11, wherein the second species is a first precursor gas and the first species is a second precursor gas.

15. The method of claim 14, wherein the first precursor gas is hydrogen ($H_2$) and the second precursor gas is hydrogen chloride (HCl).

* * * * *